United States Patent [19]

Hori

[11] Patent Number: 5,512,846
[45] Date of Patent: Apr. 30, 1996

[54] SIGNAL SELECTING DEVICE CONTROLLED BY A SERIALLY TRANSMITTED MODE SIGNAL REQUIRING BUT ONE TERMINAL

[75] Inventor: Toshihiko Hori, Itami, Japan

[73] Assignee: Mitsubishi Denki Kabushiki Kaisha, Tokyo, Japan

[21] Appl. No.: 296,920

[22] Filed: Aug. 31, 1994

[30]     Foreign Application Priority Data

Sep. 6, 1993  [JP]  Japan ..................... 5-221106

[51] Int. Cl.[6] ................... H03K 17/00; H03K 3/027
[52] U.S. Cl. ................. 326/105; 340/825.68; 377/56; 377/76; 377/54
[58] Field of Search ................. 377/56, 76, 77, 377/54, 72, 73, 75; 326/105, 106; 340/825.57, 825.62, 825.68; 341/22

[56]               References Cited

U.S. PATENT DOCUMENTS

| | | | |
|---|---|---|---|
| 3,633,166 | 1/1972 | Picard | 340/825.68 |
| 3,774,056 | 11/1973 | Sample et al. | 307/105 |
| 3,849,634 | 11/1974 | Saltini et al. | 377/54 |
| 4,127,823 | 11/1978 | Frost | 377/110 |
| 4,935,944 | 6/1990 | Everett | 377/56 |
| 5,060,244 | 10/1991 | Robertson | 377/54 |
| 5,323,438 | 6/1994 | Kim | 377/54 |

OTHER PUBLICATIONS

Halbleiter–Schaltungstechnik, Tietze, et al., 1983, 6th editon, pp. 224–227.

*Primary Examiner*—John S. Heyman
*Attorney, Agent, or Firm*—Oblon, Spivak, McClelland, Maier & Neustadt

[57]            ABSTRACT

In a signal selecting device, a mode determination portion 61 comprises a shift register 11, a clock generating portion 20 and decoder 51. The clock generating portion 20 receives a mode signal M and generates a clock signal CK1 used for decoding the mode signal M from a system clock SYS. The shift register 11 receives the mode signal M and the clock signal CK1 and outputs signals $Q_0$ to $Q_3$. The decoder 51 receives the output from the shift register 11 and outputs control signals $S_{00}$ to $S_{03}$. Therefore, there needs only one terminal for receiving the mode signal M and no terminal for receiving a clock.

16 Claims, 19 Drawing Sheets

FIG. 19 (BACKGROUND ART)

| M1 | M2 | S00 | S01 | S02 | S03 | OUT |
|---|---|---|---|---|---|---|
| 0 | 0 | 1 | 0 | 0 | 0 | P1 |
| 1 | 0 | 0 | 1 | 0 | 0 | P2 |
| 0 | 1 | 0 | 0 | 1 | 0 | P3 |
| 1 | 1 | 0 | 0 | 0 | 1 | P4 |

SIGNAL SELECTING DEVICE CONTROLLED BY A SERIALLY TRANSMITTED MODE SIGNAL REQUIRING BUT ONE TERMINAL

BACKGROUND OF THE INVENTION

1. Field of the Invention

The present invention relates in general to a semiconductor integrated circuit, and more particularly to a technique of selecting a signal used therein.

2. Description of the Background Art

FIG. 18 is a circuit diagram showing a configuration of conventional signal selecting means 200 in a conventional semiconductor integrated circuit. The signal selecting means 200 comprises a mode determination unit 6 and a logical processing unit 7.

In the logical processing unit 7, signal conductors 21 to 24 are connected to input ends of AND gates 3a to 3d respectively, and input signals $P_1$ to $P_4$ fed to the signal conductors 21 to 24 can be transmitted to an input end of an OR gate 4 only when the AND gates 3a to 3d are open, respectively. The AND gates 3a to 3d are open in mutually exclusive manner, so that only one of the input signals $P_1$ to $P_4$ can become an effective input for the OR gate 4 and an output end of the OR gate 4 outputs the one of input signals $P_1$ to $P_4$ as effective data OUT.

The mode determination unit 6 is provided for the purpose of opening the AND gates 3a to 3d in mutually exclusive manner as mentioned above. In the mode determination unit 6, a decoder 5 outputs four control signals $S_{00}$ to $S_{03}$ to the respective other input ends of the AND gates 3a to 3d. The four control signals $S_{00}$ to $S_{03}$ are generated by decoding a 2-bit mode signal $M_1M_2$ fed to the decoder 5.

FIG. 19 is a conversion table of decoding. According to the four possible combinations of logical values of the 2-bit mode signal $M_1M_2$, the control signals $S_{00}$ to $S_{03}$ to be outputted from the decoder 5 take the logical value "1" in mutually exclusive manner. For example, when the mode signal $M_1M_2$ takes the logical values "1", "0", $P_2$ is taken as the data OUT. In order to perform such decoding operation, the decoder 5 is supplied with a decoding clock CKD from the outside.

Thus, the signal selecting means 200 has a function of selectively outputting only one of the input signals $P_1$ to $P_4$ applied from the outside in accordance with the 2-bit mode signal $M_1M_2$ also applied from the outside.

As described with respect to the signal selecting means 200, in the prior art, a mode signal having a plurality of bits are required for selectively outputting a plurality of input signals applied from the outside. As the integrated circuit processes a greater deal of logical values, the number of the input signals to be selected becomes larger. In the prior art technique, this also invites an increase of the number of bits of the mode signal and accordingly, the number of input terminals for receiving them. Therefore, there arises the great disadvantage of inviting degradation of integration which is an important factor in the integrated circuit.

Conversely, there is the problem that if the number of input terminals for receiving the mode signal is fixed, the number of input signals to be selected should be limited.

Furthermore, in decoding, the decoding clock should be supplied from the outside and a terminal for receiving it is further required.

SUMMARY OF THE INVENTION

According to the present invention, a signal selecting device comprises: (a) a mode determination portion having: (a-1) an input terminal for receiving a mode signal; and (a-2) decoder means for decoding the mode signal in accordance with a clock signal into a plurality of control signals to be outputted, for outputting a plurality of operation mode selection signals in accordance with the plurality of control signals; and (b) a logical processing portion having: (b-1) a plurality of first input ends for receiving a plurality of signals to be selected respectively; (b-2) a plurality of second input ends for receiving the plurality of operation mode selection signals; and (b-3) an output end for outputting one of the signals to be selected in accordance with the plurality of operation mode selection signals.

Preferably, the plurality of control signals each serve as the operation mode selection signal.

Preferably, the decoder means includes (a-2-1) a clock generating portion for generating the clock signal from a system clock for a semiconductor integrated circuit including the signal selecting device and the mode signal; (a-2-2) a first shift register for shifting the mode signal in sequence in accordance with the clock signal to obtain a transformed mode signal to be outputted; and (a-2-3) a decoder for decoding the transformed mode signal into the control signals to be outputted. The mode determination portion further has (a-3) a first logic circuit for applying a predetermined logical process to the control signals to obtain the operation mode selection signals to be outputted.

Preferably, the plurality of control signals are classified into (y-1) a default control signal which is activated when the mode signal has no effective information; and (y-2) a plurality of specific control signals other than the default control signal. The first logic circuit further comprises (a-3-1) information retaining means, having: (a-3-1-1) a set terminal for receiving one of the plurality of specific control signals; and (a-3-1-2) an output terminal for retaining the one of specific control signals to output a first of the operation mode selection signals, and (a-3-2) a NOR gate for taking an inversion of logical sum of the specific control signals other than the one specific control signal and the first operation mode selection signal to generate a second of the operation mode selection signals. The second operation mode selection signal is activated when the mode signal has no effective information, and the first and second operation mode selection signals are activated in a mutually exclusive manner.

Preferably, the plurality of control signals are classified as shown in (y-1) and (y-2) and the first logic circuit further comprises (a-3-3) information retaining means, having: (a-3-3-1) a set terminal for receiving one of the plurality of specific control signals; (a-3-3-2) an output terminal for retaining the one of specific control signals to output a first of the operation mode selection signals; and (a-3-3-3) a reset terminal for resetting data applied to the output terminal, and (a-3-4) a NOR gate for taking an inversion of logical sum the specific control signals other than the one specific control signal and the first operation mode selection signal to generate a second of the operation mode selection signals; (a-3-5) a timer triggered in accordance with the one of specific control signals, for counting a predetermined time to output a transformed signal; and (a-3-6) an AND gate for taking a logical product of the first operation mode selection signal and the transformed signal to provide the logical product for the reset terminal of the information retaining means. The second operation mode selection signal is activated when the mode signal has no effective information, and the first and second operation mode selection signals are activated in a mutually exclusive manner.

Preferably, the plurality of control signals are classified as shown in (y-1) and (y-2) and the first logic circuit further comprises (a-3-7) first information retaining means, having: (a-3-7-1) a trigger terminal for receiving one of the plurality of specific control signals; (a-3-7-2) an output terminal for outputting a transformed signal of which state is inverted in response to a change in logical state of the one of specific control signals; (a-3-7-3) a reset terminal for resetting data applied to the output terminal, and (a-3-8) an AND gate for taking a logical product of the one of specific control signals and the transformed signal to be outputted; (a-3-9) second information retaining means, having: (a-3-9-1) a set terminal for receiving an output from the AND gate; (a-3-9-2) an output terminal for retaining the output from the AND gate at the set terminal of the second information retaining means to output a first of the operation mode selection signals; (a-3-9-3) a reset terminal for resetting data applied to the output terminal of the second information retaining means, and (a-3-10) a NOR gate for taking an inversion of logical sum of the specific control signals other than the one specific control signal and the first operation mode selection signal to generate a second of the operation mode selection signals. The second operation mode selection signal is activated when the mode signal has no effective information, and the first and second operation mode selection signals are activated in a mutually exclusive manner.

Still preferably, the mode determination portion further has (a-4) a potential point for applying a constant potential; and (a-5) a resistor for connecting the potential point to the input terminal.

The mode signal in accordance with the present invention is serially transmitted and then decoded by the decoding means, thereby obtaining the control signal.

In the mode determination portion, the logic circuit generates the operation mode selection signal from the control signal.

The logical processing portion selects one among the plurality of signals to be selected in accordance with the operation mode selection signal.

The clock generating portion generates the clock signal used for decoding the mode signal from the system clock and the mode signal.

The resistor fixes the voltage of the input terminal when the input terminal is not supplied with the mode signal.

Thus, in accordance with the present invention, since the mode signal which controls selection of the signals to be selected can be serially transmitted, it is possible to save the number of the input terminals for receiving the mode signal and prevent the semiconductor integrated circuit integration from being deteriorated. Moreover, since the clock signal used for decoding the mode signal is generated from the mode signal and the system clock of the semiconductor integrated circuit, there is no need of the clock signal fed from the outside and further of the terminal for receiving it.

In addition, the dynamic selection of the signals to be selected can ensure reduction in operation time.

Furthermore, by connecting the input terminal to the potential point through the resistance, the input terminal can be fed with the predetermined potential when the mode signal is not applied thereto.

An object of the present invention is to provide a semiconductor integrated circuit device which is capable of selecting a great deal of input signals even with a small number of terminals used for receiving the mode signal and which has no need of decoding clock supplied from the outside, thus improving its integration.

These and other objects, features, aspects and advantages of the present invention will become more apparent from the following detailed description of the present invention when taken in conjunction with the accompanying drawings.

BRIEF DESCRIPTION OF THE DRAWINGS

FIG. 19 is a conversion table of the conventional art.

DESCRIPTION OF THE PREFERRED EMBODIMENTS

Figure 1:
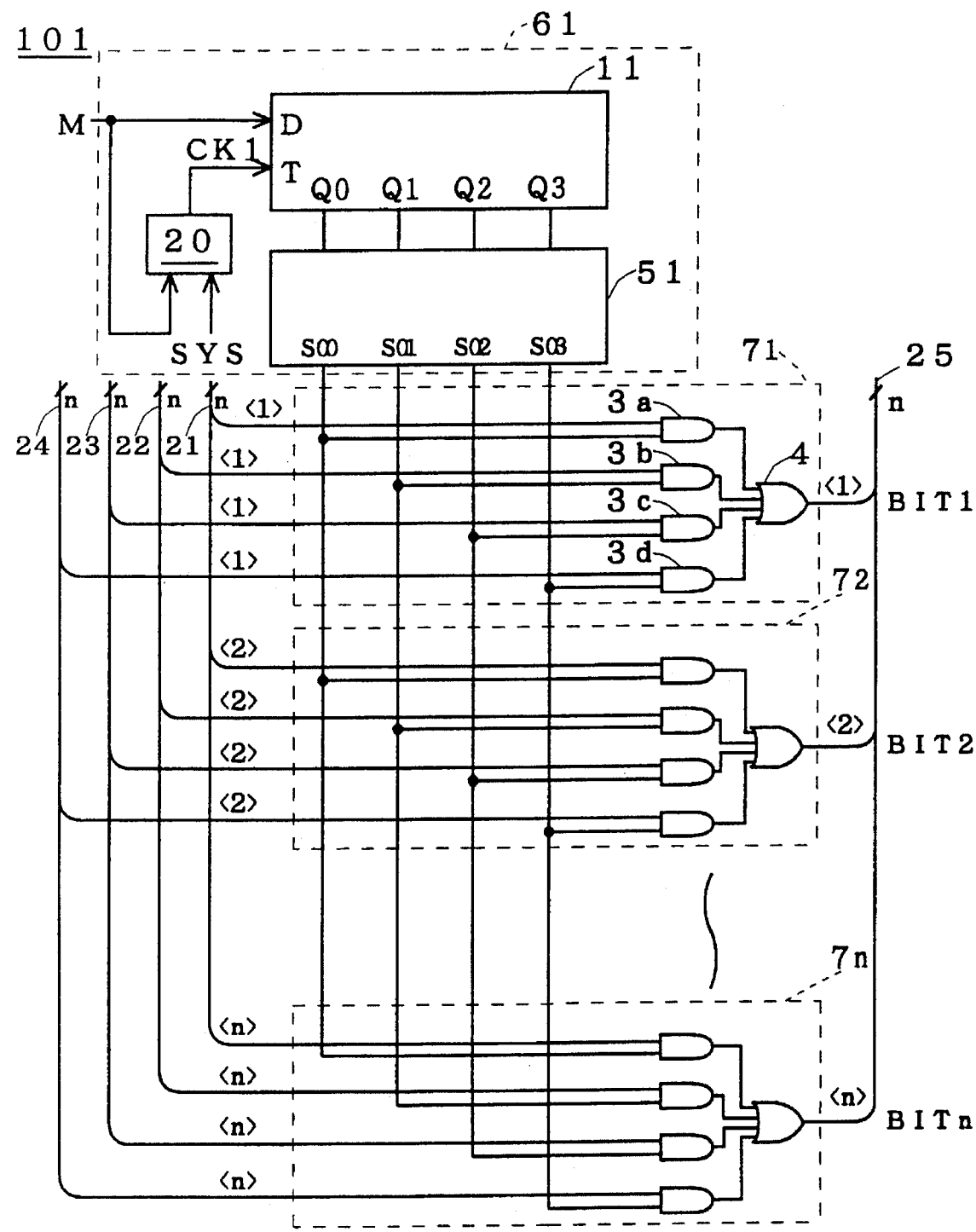
FIG. 1 is a circuit diagram showing the first preferred embodiment of the present invention.

A. The First Preferred Embodiment:
(A-1) Overall Structure:
FIG. 1 is a circuit diagram showing a configuration of a signal selecting means 101 in accordance with the present invention. The signal selecting means 101 comprises a mode determination unit 61 and a logical processing unit 71. In the first preferred embodiment, a signal of n bit is used as an input signal to be selected. Signal conductors 21 to 24 are n-bit bus signal conductors. Accordingly, the logical processing units $7_1, 7_2, \ldots$ and $7_n$ are disposed in parallel. The outputs from the logical processing units $7_1, 7_2 \ldots$ and $7_n$ are put together into an n-bit signal to be applied to an n-bit signal conductor 25.

The logical processing units $7_1, 7_2, \ldots$ and $7_n$ each have the same arrangement as the logical processing unit 7 in the conventional signal selecting means 200. Specifically, AND gates 3a to 3d each have two input ends, and each output the logical product of signals applied to the two input ends respectively to an input end of an OR gate 4. The AND gates 3a to 3d are connected to the 1-bit signal conductors 21 to 24 by one input end and receive control signals $S_{00}$ to $S_{03}$ by the other input end, respectively.

The mode determination unit 61 comprises a shift register 11, a clock generating unit 20 for generating a clock signal CK1 to control the operation of the shift register 11 and a decoder 51 for decoding output signals $Q_0$ to $Q_3$ from the shift register 11 to output the control signals $S_{00}$ to $S_{03}$.

Figure 2:
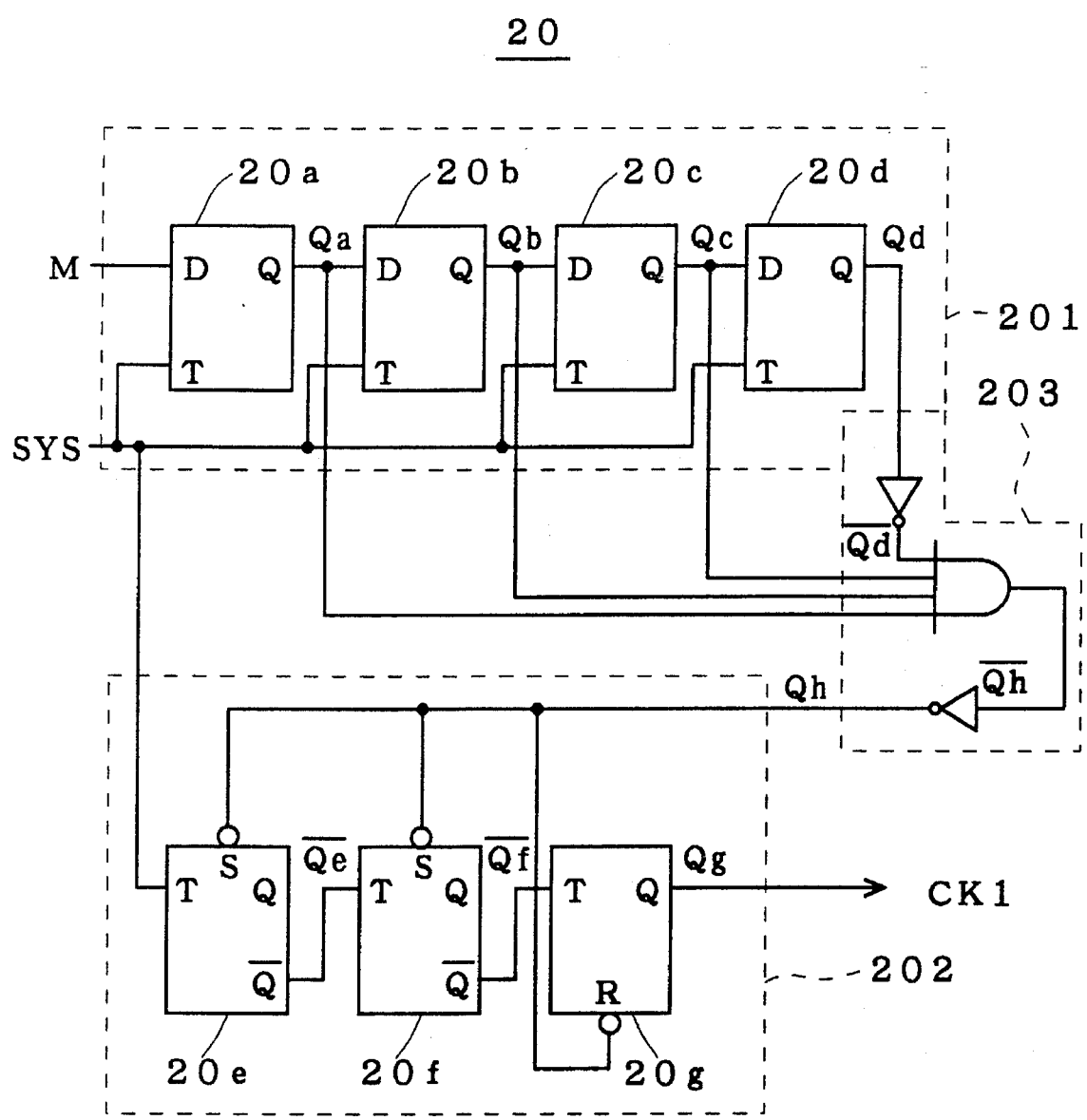
FIG. 2 is a circuit diagram showing the clock generator of FIG. 1 of the present invention.

(A-2) Generation of Clock Signal CK1:

FIG. 2 is a circuit diagram showing a configuration of the clock generating unit 20. The clock generating unit 20 comprises a 4-bit shift register 201, a 3-bit binary counter 202 and a gate portion 203. The 4-bit shift register 201 is supplied with a mode signal M which indirectly controls the operation of the logical processing unit 7 and a system clock SYS. The mode signal M is supplied from the outside of the semiconductor integrated circuit. The semiconductor integrated circuit including the signal selecting means 101 has a clock therein. In the semiconductor integrated circuit, its operation timing relies on the clock, which is the above-mentioned system clock SYS. Therefore, it is possible to generate the clock signal CK1 required for decoding the mode signal M within the semiconductor integrated circuit without the decoding clock CKD which is separately supplied from the outside like in the conventional art.

In general, the system clock SYS has higher frequency than that of the mode signal M. For example, the frequency of the system clock SYS is 8 $MH_z$ and that of the mode signal M is 1 $MH_z$. The clock signal CK1 is generated in synchronization with the mode signal M. The method of generating the clock signal CK1, together with the arrangements of the 4-bit shift registers 201 and 3-bit binary counter 202, will be described below.

The 4-bit shift register 201 has an arrangement where four D flip flops 20a to 20d are connected in series. The D flip flop 20a receives the mode signal M by its data input end D and outputs a signal $Q_a$. The D flip flop 20b receives the signal $Q_a$ by its input end D and outputs a signal $Q_b$. The D flip flops 20c and 20d likewise output signals $Q_c$ and $Q_d$, respectively. The four D flip flops 20a to 20d each have a clock terminal T which receives the system clock SYS.

The gate portion 203 receives the signals $Q_a$ to $Q_d$ and performs a logical process to output a signal $Q_h = \overline{Q_a} \cdot Q_b \cdot Q_c \cdot \overline{Q_d}$, wherein the symbol "·" represents a logical product. The logical inversion is represented by using an overbar.

The 3-bit binary counter 202 detects the signal $Q_h$ and then counts up the system clock SYS to generate the clock signal CK1. The 3-bit binary counter 202 has an arrangement where three RS flip flops 20e to 20g are connected in series. The signal $Q_h$ is applied to set terminals S of RS flip flops 20e and 20f and a reset terminal R of the RS flip flop 20g. The RS flip flop 20e receives the system clock SYS by its clock terminal T and outputs a signal $\overline{Q_e}$. The RS flip flop 20f receives the signal $\overline{Q_e}$ by its clock terminal T and outputs a signal $\overline{Q_f}$. The RS flip flop 20g receives the $\overline{Q_f}$ by its clock terminal T and outputs a signal $Q_g$. The signal $Q_g$ serves as the clock signal CK1. Furthermore, the 3-bit binary counter 202 has a preset value of "3".

Figure 3:
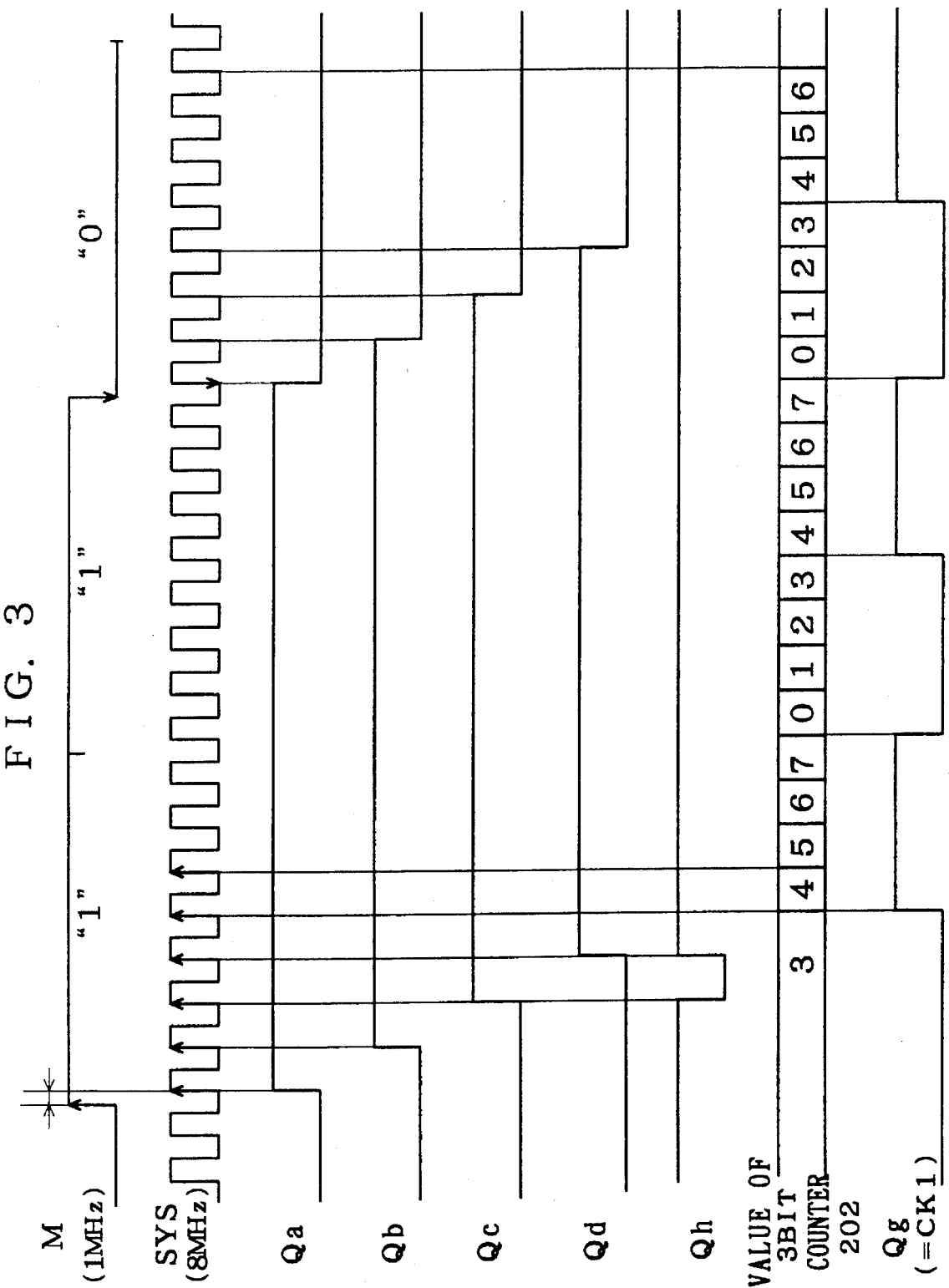
FIG. 3 is a waveform chart illustrating the operation in accordance with the first preferred embodiment of the present invention.

FIG. 3 is a waveform chart illustrating the generation of the clock signal CK1 of 1 MHz where the interval of adjoining changes in logical state of the mode signal M is equal to the cycle when the frequency is 1 MHz and the system clock SYS has a frequency of 8 MHz. The rise of the system clock SYS just after the rise of the mode signal M causes the rise of the signal $Q_a$. After that, the signals $Q_b$, $Q_c$ and $Q_d$ rise in sequence with every rise of the system clock SYS. Therefore, the signal $Q_h$ detects the rise of the mode signal M. The 3-bit binary counter 202 which is preset in accordance with the signal $Q_h$ starts counting from the value "3". The signal $Q_g$ rises when the 3-bit binary counter obtains the value "4" and falls after the 3-bit binary counter obtains the value "7".

The 3-bit binary counter 202 divides the frequency of the system clock SYS, 8 MHz, three times, so that the signal $Q_g$ to be outputted has a frequency of 1 MHz. Once the rise of the mode signal M is detected, the rise of the signal $Q_g$ is always repeated regardless the logical state of the mode signal M. Furthermore, since the 3-bit binary counter 202 has a preset value of "3", the signal $Q_g$ has a duty of 50% and rises at the almost center point of adjoining changes in logical state of the mode signal M.

Even if the phase of the mode signal M deviates, using a code system in which the first value in the effective bit rows of the mode signal M is "1" makes it possible to ensure the rise of the signal $Q_g$ at the almost center point of adjoining changes in logical state of the mode signal M in any time. Therefore, it is still easy to decode the mode signal M in accordance with the signal $Q_g$ as the clock signal CK1.

Figure 4:
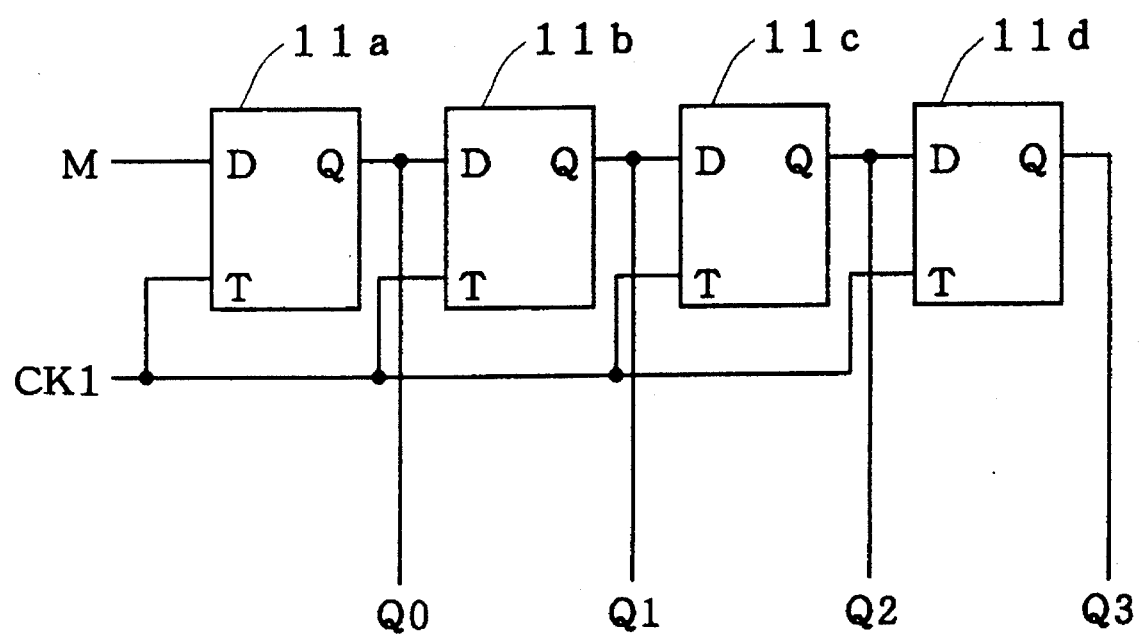
FIG. 4 is a circuit diagram showing the first preferred embodiment of the present invention.

(A-3) Decoding of Mode Signal M:

FIG. 4 is a circuit diagram showing a configuration of the shift register 11. The shift register 11 has an arrangement where four D flip flops 11a to 11d are connected in series like the 4-bit shift register 201, the D flip flops 11a to 11d each have a clock terminal T which receives the clock signal CK1. A data input end D of the D flip flop 11a receives the mode signal M. The D flip flops 11a to 11c output the signals $Q_0$ to $Q_2$ to the data input ends D of the D flip flops 11b to 11d, respectively. The D flip flop 11d outputs the signal $Q_3$.

Figure 5:
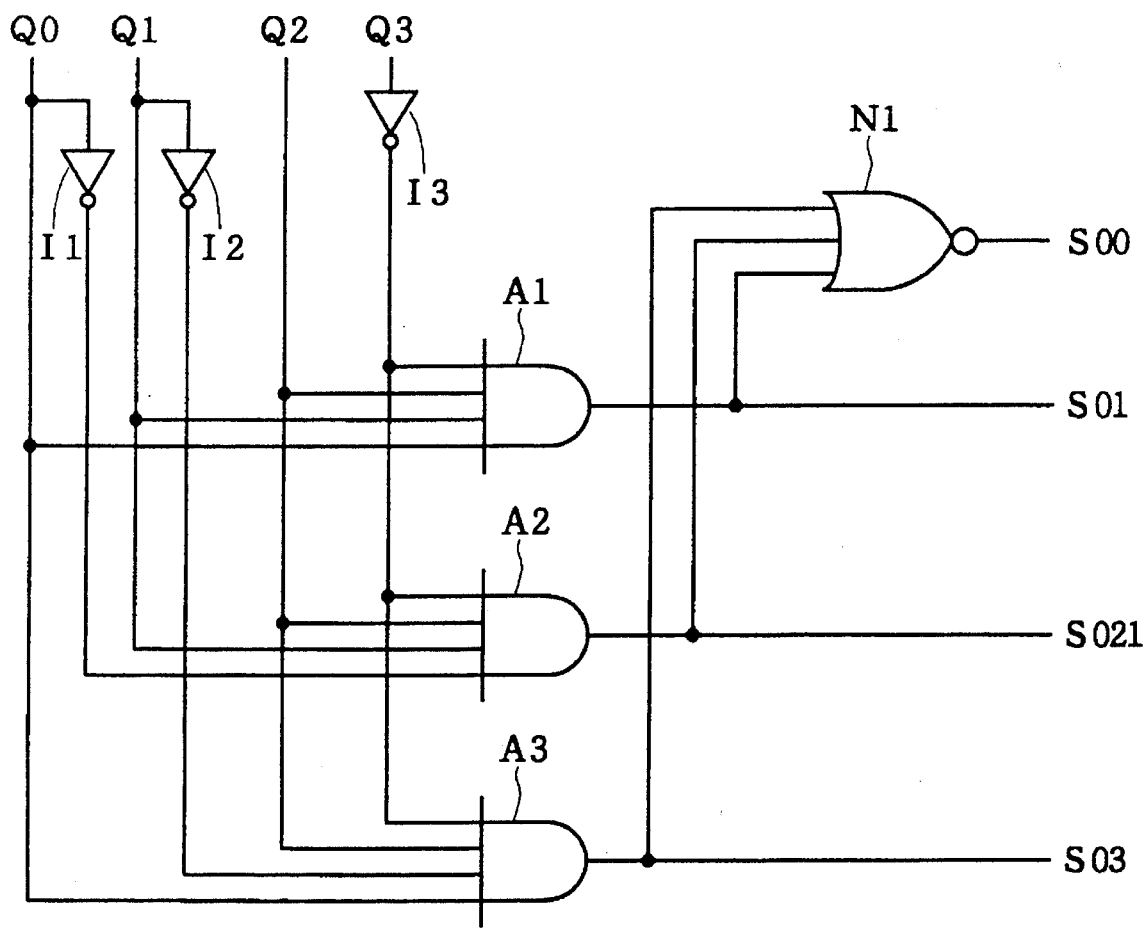
FIG. 5 is a circuit diagram showing the first preferred embodiment of the present invention.

FIG. 5 is a circuit diagram showing a configuration of the decoder 51. The decoder 51 receives the signals $Q_0$ to $Q_3$ and outputs the control signals $S_{00}$ to $S_{03}$. As can be seen from FIG. 5, the decoder 51 consists of inverters $I_1$ to $I_3$, AND gates $A_1$ to $A_3$ and a NOR gate $N_1$, and therefore the control signals are expressed as follows;

$S_{00} = \overline{S_{01} + S_{02} + S_{03}}$
$S_{01} = Q_0 \cdot Q_1 \cdot Q_2 \cdot \overline{Q_3}$
$S_{02} = \overline{Q_0} \cdot Q_1 \cdot Q_2 \cdot \overline{Q_3}$
$S_{03} = Q_0 \cdot \overline{Q_1} \cdot Q_2 \cdot \overline{QQ_3}$ where the symbol "+" represents logical sum. Thus, the control signals $S_{00}$ to $S_{03}$ are mutually exclusive.

Furthermore, when the mode signal M always takes the value "0", i.e., the mode signal M has no effective value, the signals $Q_0$ to $Q_3$ all take "0" as can be seen from FIG. 1. In this case, the control signals $S_{01}$ to $S_{03}$ all take "0" and accordingly the control signal $S_{00}$ which is exclusive to these control signals always takes "1". In short, the control signal $S_{00}$ takes "1" when the mode signal M has no effective value (hereinafter such a signal will be referred to as "default").

Figure 6:
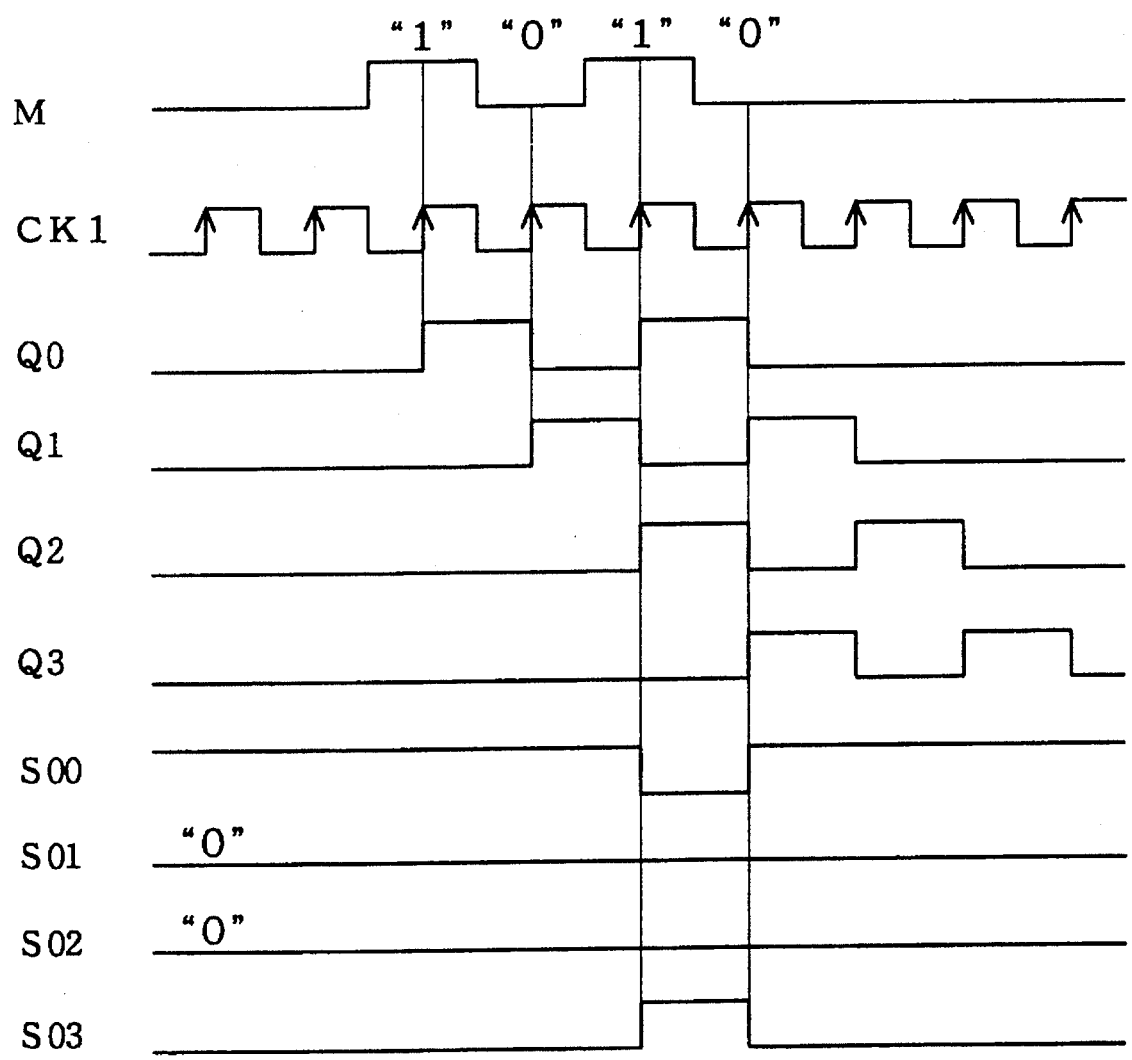
FIG. 6 is a waveform chart illustrating the operation in accordance with the first preferred embodiment of the present invention.

FIG. 6 is a waveform chart illustrating the generation of the control signals $S_{00}$ to $S_{03}$. Now we will consider a case where the mode signal M delivers bit rows of "1010".

As described in "(A-2) Generation of Clock Signal CK1", the clock signal CK1 rises at the almost center point of adjoining changes in logical state of the mode signal M. Further, the rises of the signals $Q_0$ to $Q_3$ are caused by the rise of the clock signal CK1, as shown in FIG. 6. As a result, the control signals $S_{01}$ to $S_{03}$ have the waveforms as shown in FIG. 6. Only the control signal $S_{03}$ takes "1" and the control signals $S_{01}$ and $S_{02}$ always take "0". On the other hand, the control signal $S_{00}$ takes "0" only when the control signal $S_{03}$ takes "1", and otherwise remains at logic "1".

Figure 7:
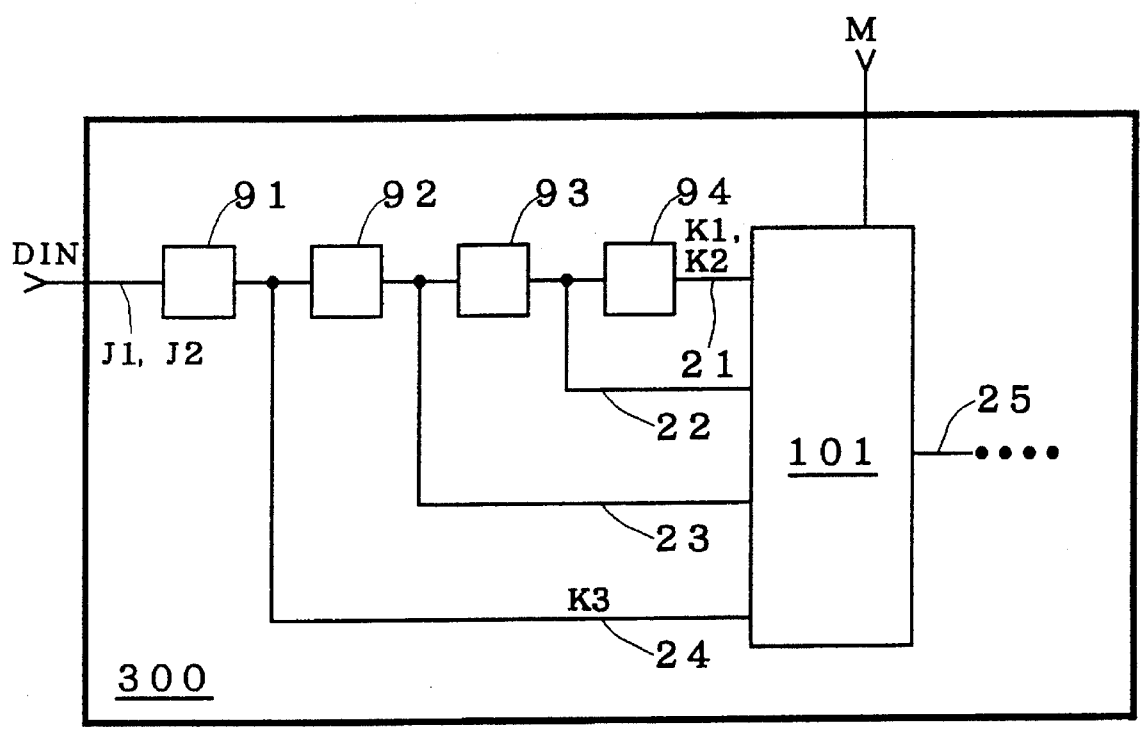
FIG. 7 is a circuit diagram showing the first preferred embodiment of the present invention.

(A-4) Signal Selection:

FIG. 7 is a block diagram showing a configuration of a semiconductor integrated circuit 300 including the signal selecting means 101. The semiconductor integrated circuit 300 comprises signal processing units 91 to 94 disposed before the signal selecting means 101. The signal processing units 91 to 94 process signals DIN inputted to the semiconductor integrated circuit 300 and then transmit respective processed results to the signal conductors 21 to 24. For example, the signal conductor 21 is supplied with a processed result of the signal DIN conducted by the signal processing units 91 to 94. The signal conductor 22 is supplied with a processed result of the signal DIN conducted by the signal processing units 91 to 93. The signal conductor 23 is supplied with a processed result of the signal DIN conducted by the signal processing units 91 and 92. The signal conductor 24 is supplied with a processed result of the signal DIN conducted by the signal processing units 91. Then, the signal selecting means 101 selectively transmits one of the results of the signal conductors 21 to 24 to the signal conductor 25.

Figure 8:
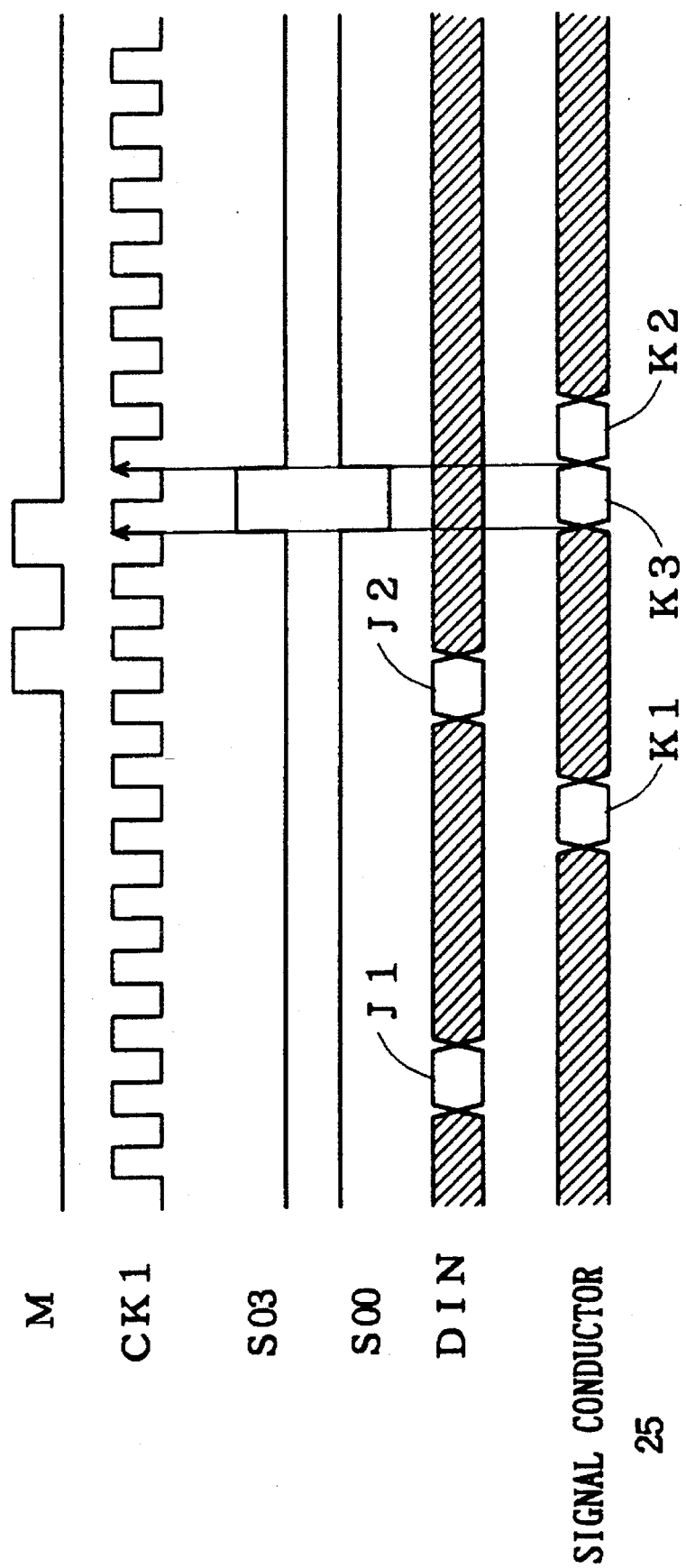
FIG. 8 is a waveform chart illustrating the operation in accordance with the first preferred embodiment of the present invention.

FIG. 8 is a waveform chart of the signal selection conducted in accordance with the control signal $S_{03}$. The signals DIN are inputted to the semiconductor integrated circuit 300 and then the effective data J1 and J2 among these signals are processed by the signal processing units 91 to 94. Result data K1 and K2 in response to the data J1 and J2 are delivered through the signal conductor 21 to the signal selecting means 101. The data K1 and K2 are transmitted to the signal conductor 25 from the signal selecting means 101 only when the control signal $S_{00}$ takes "1", i.e., the signal M has no effective data.

On the other hand, the signal conductor 24 is fed with a processed result of the signal DIN conducted by the signal processing unit 91. Since result data K3 in response to the data J2, for example, has not been processed by the signal processing units 92 to 94, the data K3 arrives at the signal selecting means 101 earlier than the data K2. Therefore, when the control signal $S_{03}$ takes "1" and accordingly the control signal $S_{00}$ takes "0" as shown in FIG. 6, the data K3, if already applied to the signal conductor 24, can be transmitted to the signal conductor 25.

Thus, by selecting the signals to be transmitted to the signal conductor 25, it is possible to check if each of the signal processing units performs a normal operation. For example, if the signal processing units 91 to 94 process the signals for ordinary operations, the operation of the signal processing unit 91 can be checked as will be mentioned below.

When the mode signal M has no effective data, only the control signal $S_{00}$ takes "1" and the signal processing units 91 to 94 perform ordinary operations. Under this condition, if the control signal $S_{03}$ takes "1" when none of the effective data K1 and K2 are transmitted to the signal conductor 25, the data K3 can be transmitted to the signal conductor 25 in the intervals of ordinary operation. In other words, a test operation can be conducted to dynamically check the operation of the signal processing unit 91 without interrupting the ordinary operation.

It is easy to control when the control signal $S_{03}$ should become logic "1" with a protocol in consideration of the respective operation times of the processing units 91 to 94.

(A-5) Effect of The First Preferred Embodiment:

Thus, according to the first preferred embodiment, signal selection is performed by decoding the mode signal M. Since the mode signals M are delivered serially, the number of terminals used for signal selection can be saved.

Moreover, since decoding operation is performed in accordance with the clock signal CK1, which is generated from the system clock SYS of the semiconductor integrated circuit including the signal selecting means 101, there is no need of clock signal from the outside. Therefore, the increase of the number of signals to be selected (i.e., the number of function) does not cause degradation in the semiconductor integrated circuit integration. In addition, the signal selection is performed dynamically without interrupting ordinary operation.

B. The Second Preferred Embodiment:

According to the first preferred embodiment, the control signal $S_{03}$ is controlled so as to become logic "1" when none of the effective data K1 and K2 are transmitted to the signal conductor 25. The second preferred embodiment will show that the control signal $S_{03}$ may be controlled so as to become logic "1" when the effective data K1 or K2 is transmitted to the signal conductor 25.

Figure 9:
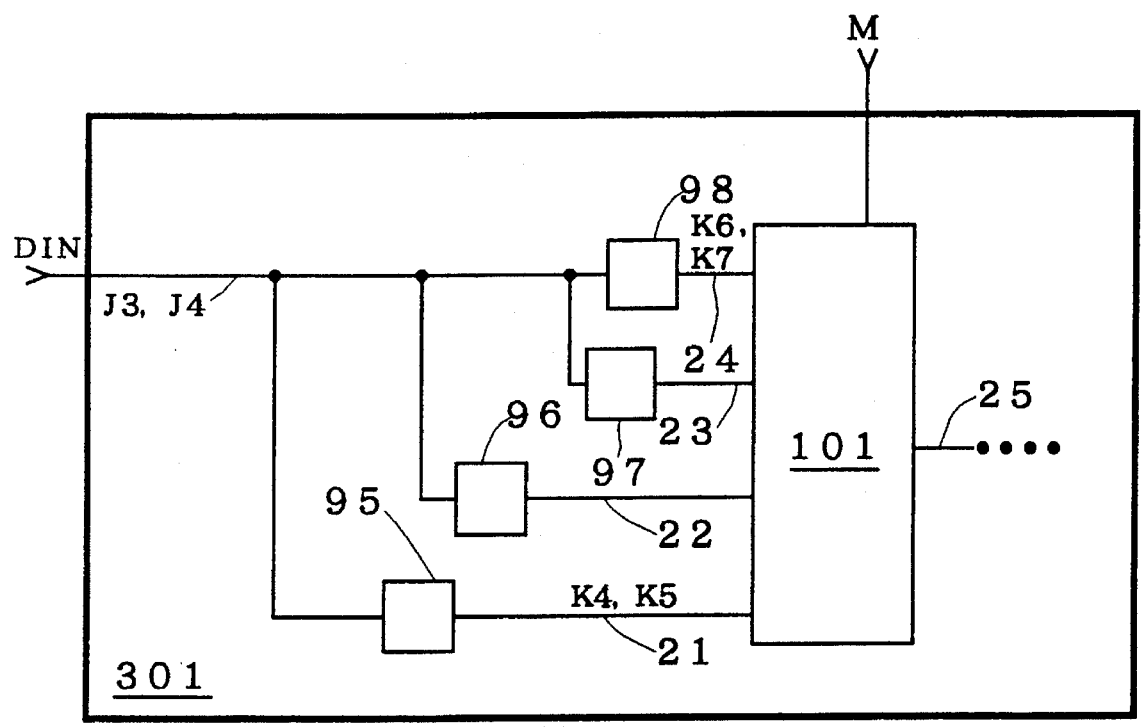
FIG. 9 is a circuit diagram showing the second preferred embodiment of the present invention.

FIG. 9 is a block diagram showing an exemplary configuration of the semiconductor integrated circuit 301 including the signal selecting means 101. The semiconductor integrated circuit 301 comprises signal processing units 95 to 98 disposed before the signal selecting means 101. The signal processing units 95 to 98 process signals DIN inputted to the semiconductor integrated circuit 301 and then transmit respective processed results to the signal conductors 21 to 24.

When the signals DIN are inputted, effective data J3 and J4 among them are processed by the signal processing unit 95 and then the processed results K4 and K5 are applied to the signal conductor 21. Likewise, the data J3 and J4 are processed by the signal processing unit 98 and then the processed results K6 and K7 are applied to the signal conductor 24. The signal processing units 96 and 97 process the data J3 and J4 and apply the processed results to the signal conductors 22 and 23, respectively.

If the signal processing units 95 and 98 have equal operation time, the data K4 and K6 are applied to the signal conductors 21 and 24 at the same time and the data K5 and K7 are applied to the signal conductors 21 and 24 at the same time.

In the semiconductor integrated circuit 301 having the foregoing arrangement, the signal selecting means 101 can change the data of the signal conductor 21 for the data of the signal conductor 24 and then transmit the changed data to the signal conductor 25. Specifically, the control signal $S_{03}$ is controlled to take "1" while the signal conductor 21 has effective data, thereby changing the signal processing function dynamically and easily.

Figure 10:
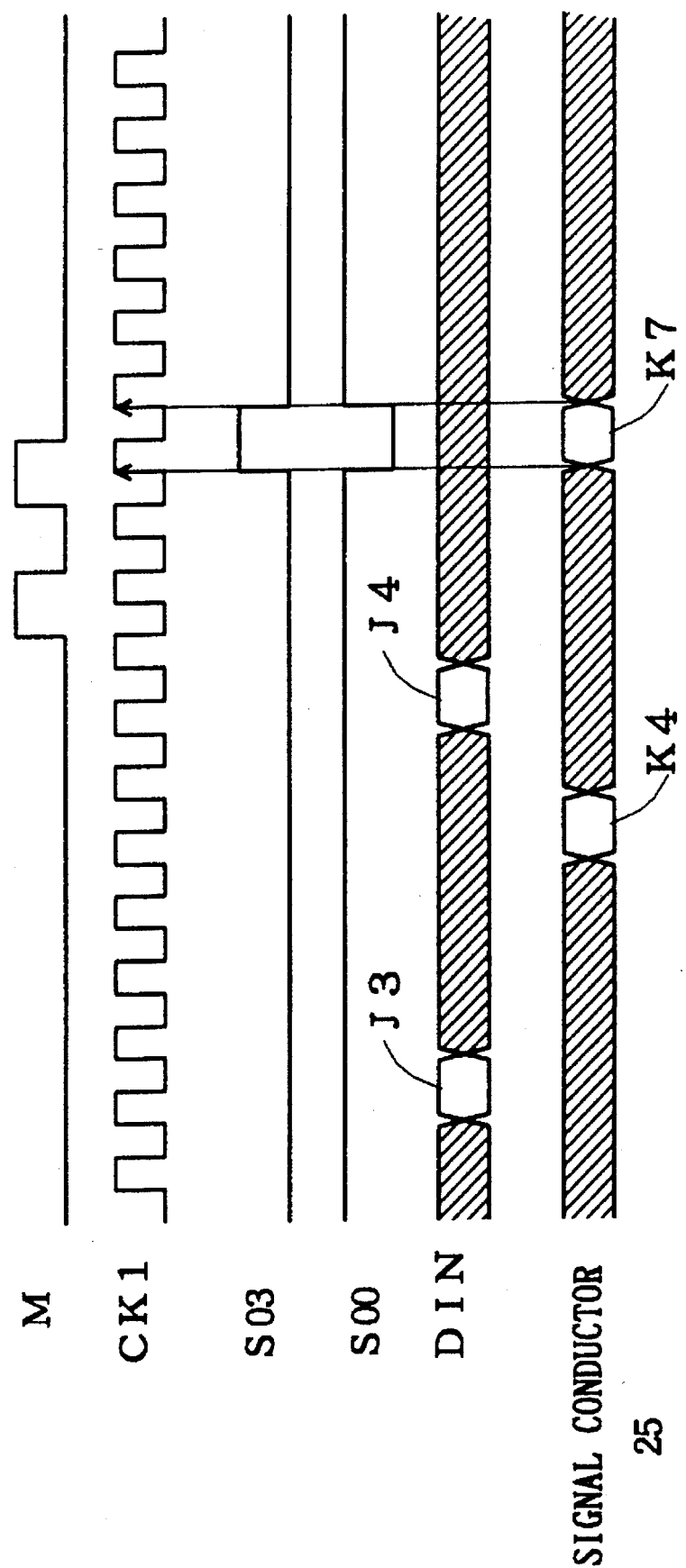
FIG. 10 is a waveform chart illustrating the operation in accordance with the second preferred embodiment of the present invention.

FIG. 10 is a waveform chart of signal selection by using the control signal $S_{03}$. When the mode signal M has no effective data, only the control signal $S_{00}$ takes "1" and the data K4 of the signal conductor 21 are transmitted to the signal conductor 25. When the mode signal M has the bit rows "1010", if the control signal $S_{03}$ takes "1" while the data K5 and K7 are obtained, the data K7 of the signal conductor 24 are transmitted to the signal conductor 25. In short, the signal selecting means 101 can control with the control signal $S_{03}$ which signal is to be transmitted, the signal processed by the signal processing unit 95 or the signal processed by the signal processing unit 98. That is, the signal selecting means 101 can selectively change one of the signal processing functions of the signal processing units 95 and 98.

Therefore, dynamic function change is easily achieved.

Figure 11:
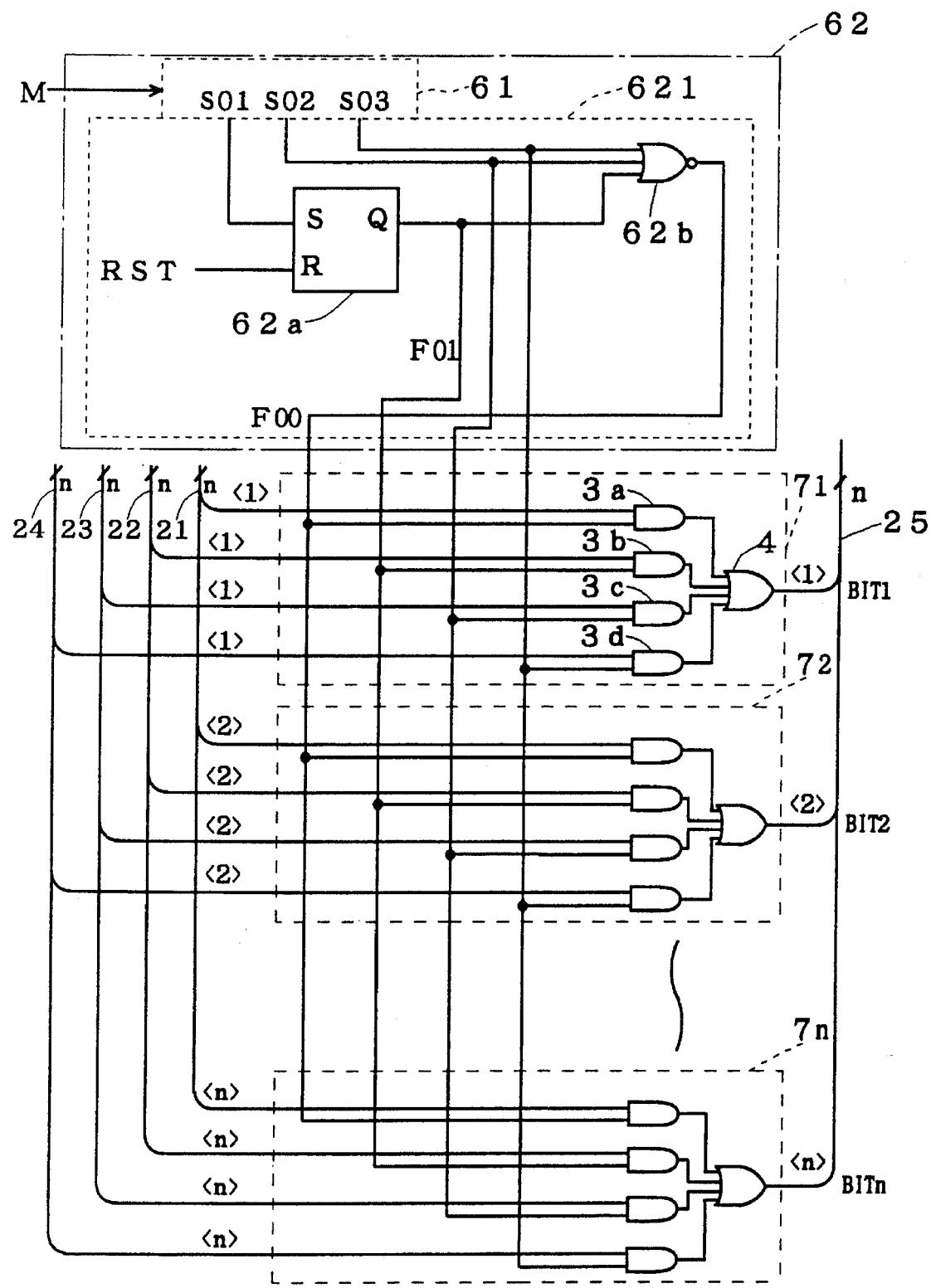
FIG. 11 is a circuit diagram showing the third preferred embodiment of the present invention.

C. The Third Preferred Embodiment:

FIG. 11 is a block diagram showing a configuration of a mode determination unit 62 and its connection with the logical processing units $7_1, 7_2, \ldots 7_n$ according to the third preferred embodiment. The mode determination unit 62 is the substitution for the mode determination unit 61 of the signal selecting means 101 according to the first preferred embodiment and has an arrangement where a logic circuit 621 is further provided. The logical processing units $7_1, 7_2, \ldots 7_n$ in the third preferred embodiment are supplied with control signals $F_{00}$ and $F_{01}$ instead of the control signals $S_{00}$ and $S_{01}$.

The logic circuit 621 has an arrangement where an RS flip flop 62a and a NOR gate 62b are provided. The RS flip flop 62a comprises a set terminal S for receiving the signal $S_{01}$ outputted from the decoder 51 and a reset terminal R for receiving a reset signal RST. The reset signal RST which resets the semiconductor integrated circuit including the mode determination unit 62 can be supplied within the semiconductor integrated circuit. The RS flip flop 62a outputs the control signal $F_{01}$, which is applied to one of the input ends of the NOR gate 62b.

The NOR gate 62b receives the signals $S_{02}$ and $S_{03}$ outputted from the decoder 51 by the other input end, and outputs the control signal $F_{00}$. Therefore, the control signal $F_{00}$ is a default like in the first preferred embodiment, taking "1" when none of the other signals $F_{01}, S_{02}$ and $S_{03}$ take "1".

Figure 12:
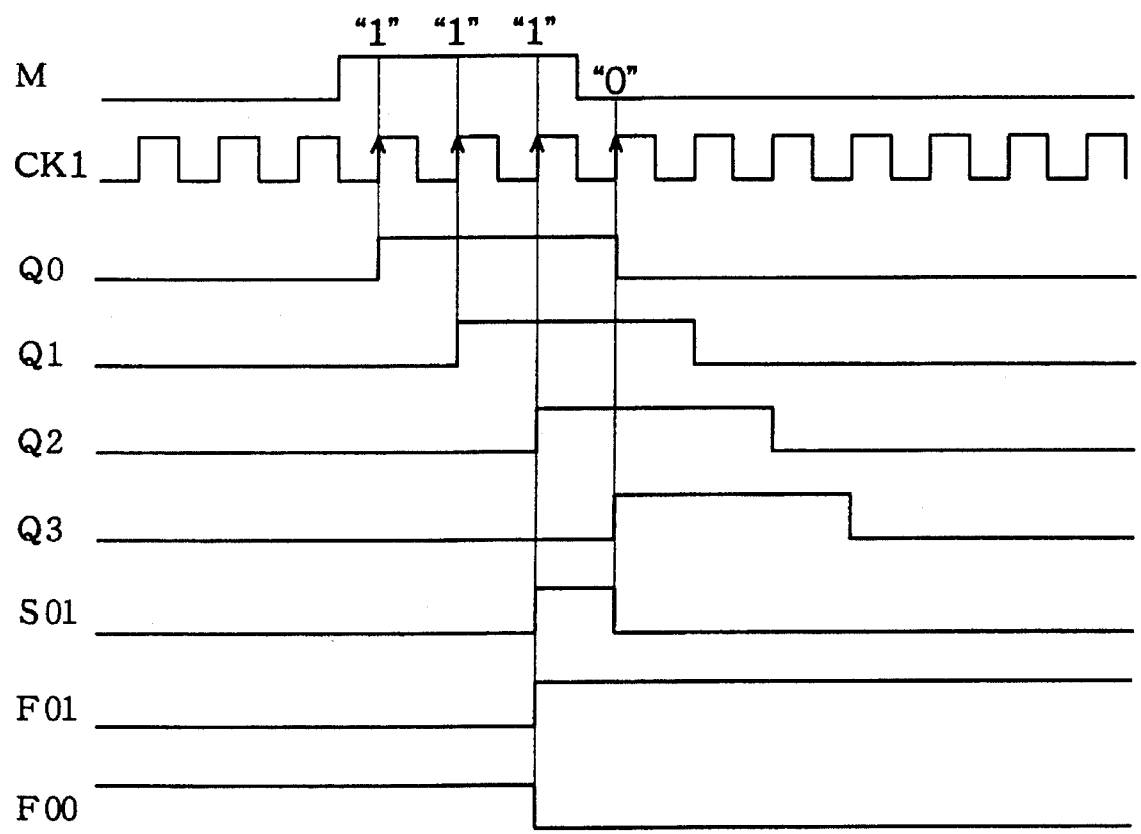
FIG. 12 is a waveform chart illustrating the operation in accordance with the third preferred embodiment of the present invention.

FIG. 12 is a waveform chart where the control signal $F_{01}$ takes "1". As can be seen the formula of the signal $S_{01}$ referring to FIG. 5 in "(A-3) Decoding of Mode Signal M", the signal $S_{01}$ takes "1" when the mode signal M has the bit rows "1110". Since the signal $S_{01}$ sets the RS flip flop 62a, the control signal $F_{01}$ remains at logic "1" until the reset signal RST is activated. In this case, the control signal $F_{00}$ remains at logic "0".

The third preferred embodiment, performing the foregoing operation, ensures fixed selection of signals. Therefore, when the signals to be selected in accordance with the control signals $F_{00}$ and $F_{01}$ are outputted from the processing units which have different and specific functions, the third preferred embodiment achieves an effect of completely switching the respective functions from one to the other.

Figure 13:
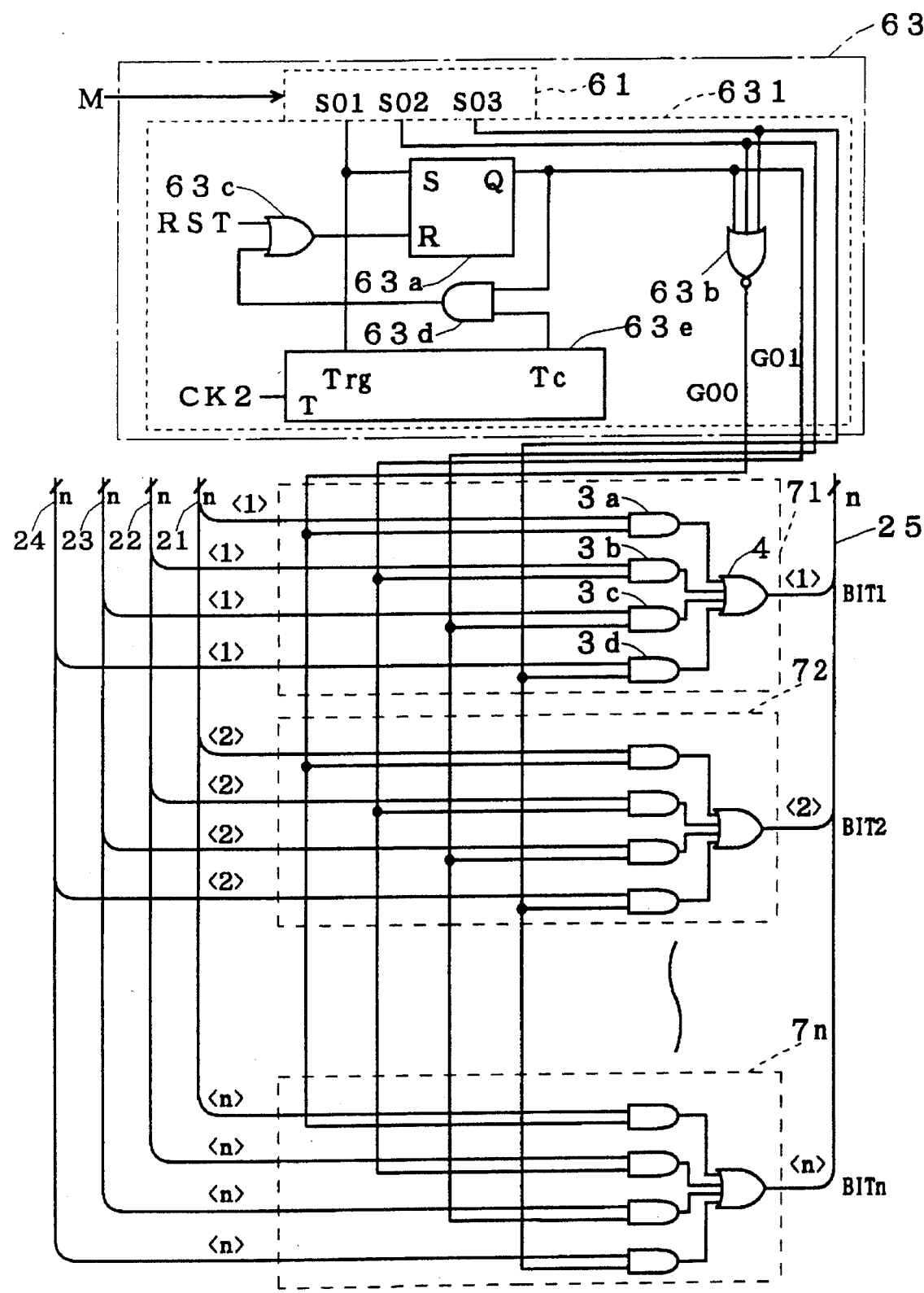
FIG. 13 is a circuit diagram showing the fourth preferred embodiment of the present invention.

D. The Fourth Preferred Embodiment:

FIG. 13 is a block diagram showing a configuration of a mode determination unit 63 and its connection with the logical processing units $7_1, 7_2, \ldots, 7_n$ according to the fourth preferred embodiment. The mode determination unit 63 is the substitution for the mode determination unit 61 of the signal selecting means 101 according to the first preferred embodiment and has an arrangement where a logic circuit 631 is further provided. The logical processing units $7_1, 7_2, \ldots 7_n$ in the fourth preferred embodiment are supplied with control signals $G_{00}$ and $G_{01}$ instead of the control signals $S_{00}$ and $S_{01}$.

The logic circuit 631 has an arrangement where an RS flip flop 63a, a NOR gate 63b, an OR gate 63c, an AND gate 63d and a timer 63e are provided. The RS flip flop 63a comprises a set terminal S for receiving the signal $S_{01}$ outputted from the decoder 51 and a reset terminal R for receiving the logical sum of a reset signal RST and an output from the AND gate 63d. Therefore, the RS flip flop 63a can be reset by not only the reset signal RST but also the output from the AND gate 63d. The RS flip flop 63a outputs the control signal $G_{01}$, which is applied to one of the input ends of the NOR gate 63b.

The NOR gate 63b receives the signals $S_{02}$ and $S_{03}$ outputted from the decoder 51 by the other input end, and outputs the control signal $G_{00}$. Therefore, the control signal $G_{00}$ is a default like in the first preferred embodiment, taking "1" when none of the other signals $G_{01}, S_{02}$ and $S_{03}$ take "1".

In the timer 63e, a clock terminal T is supplied with a timer counting clock CK2 and a trigger terminal $T_{rg}$ is supplied with a signal $S_{01}$. A result of counting by the timer 63e is fed to an output terminal $T_c$ and then the AND gate 63d obtains the logical product of the result fed to the output terminal $T_c$ and the control signal $G_{01}$.

Once the control signal $S_{01}$ takes "1", the control signal $G_{01}$ remains at logic "1" until the RS flip flop 63a is reset. Accordingly, when the timer 63e counts up to the predetermined number of times in accordance with the timer counting clock CK2 and provides the output terminal $T_c$ with the result of counting (i.e., when the count is completed), the control signal $G_{01}$ remains at logic "1". Therefore, the control signal $G_{01}$ becomes logic "0" only when the RS flip flop 63a is reset through completing the count.

Figure 14:
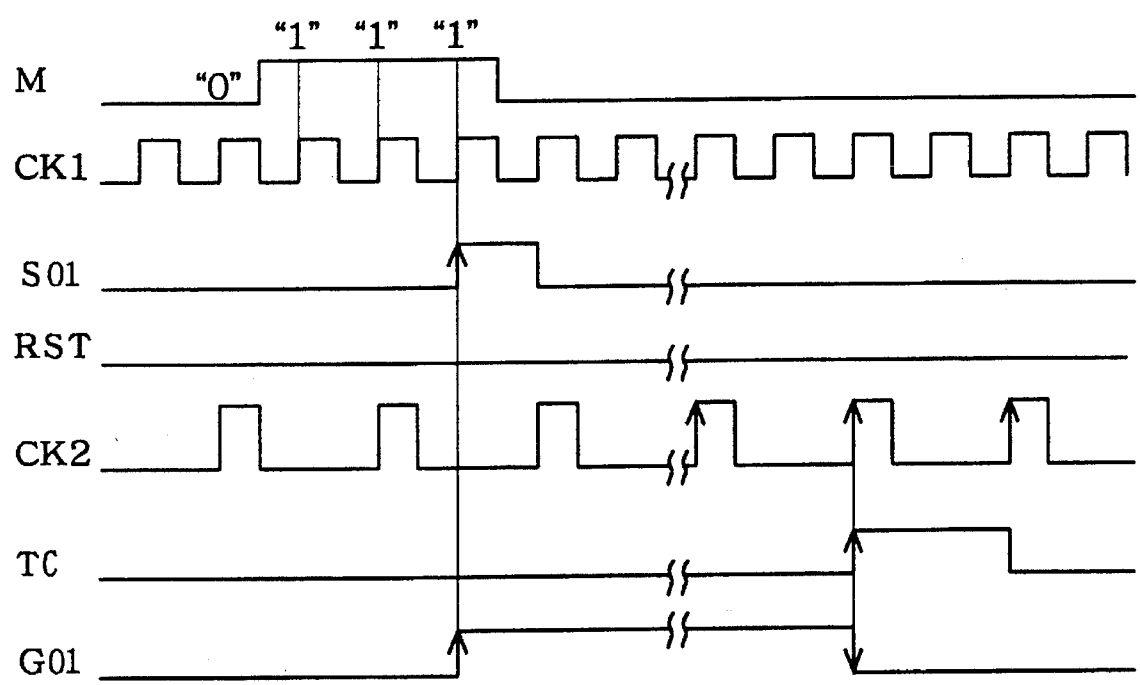
FIG. 14 is a waveform chart illustrating the operation in accordance with the fourth preferred embodiment of the present invention.

FIG. 14 is a waveform chart where the control signal $G_{01}$ takes "1". When the signal $S_{01}$ begins to take "1", the control signal $G_{01}$ rises. After that, when the count is completed and the signal applied to the output terminal $T_c$ rises, the control signal $G_{01}$ falls and then remains at logic "0".

The fourth preferred embodiment, performing the foregoing operation, ensures fixed selection of signals for a specified period. Therefore, when the signals to be selected in accordance with the control signals $G_{00}$ and $G_{01}$ are outputted from the processing units which have different and specific functions, the fourth preferred embodiment achieves an effect of switching the respective functions from one to the other for a specified period.

It is a matter of course that various arrangements may be applicable to the timer 63e of the fourth preferred embodiment so long as it can count the timer counting clock CK2 and reset the RS flip flop 63a.

Figure 15:
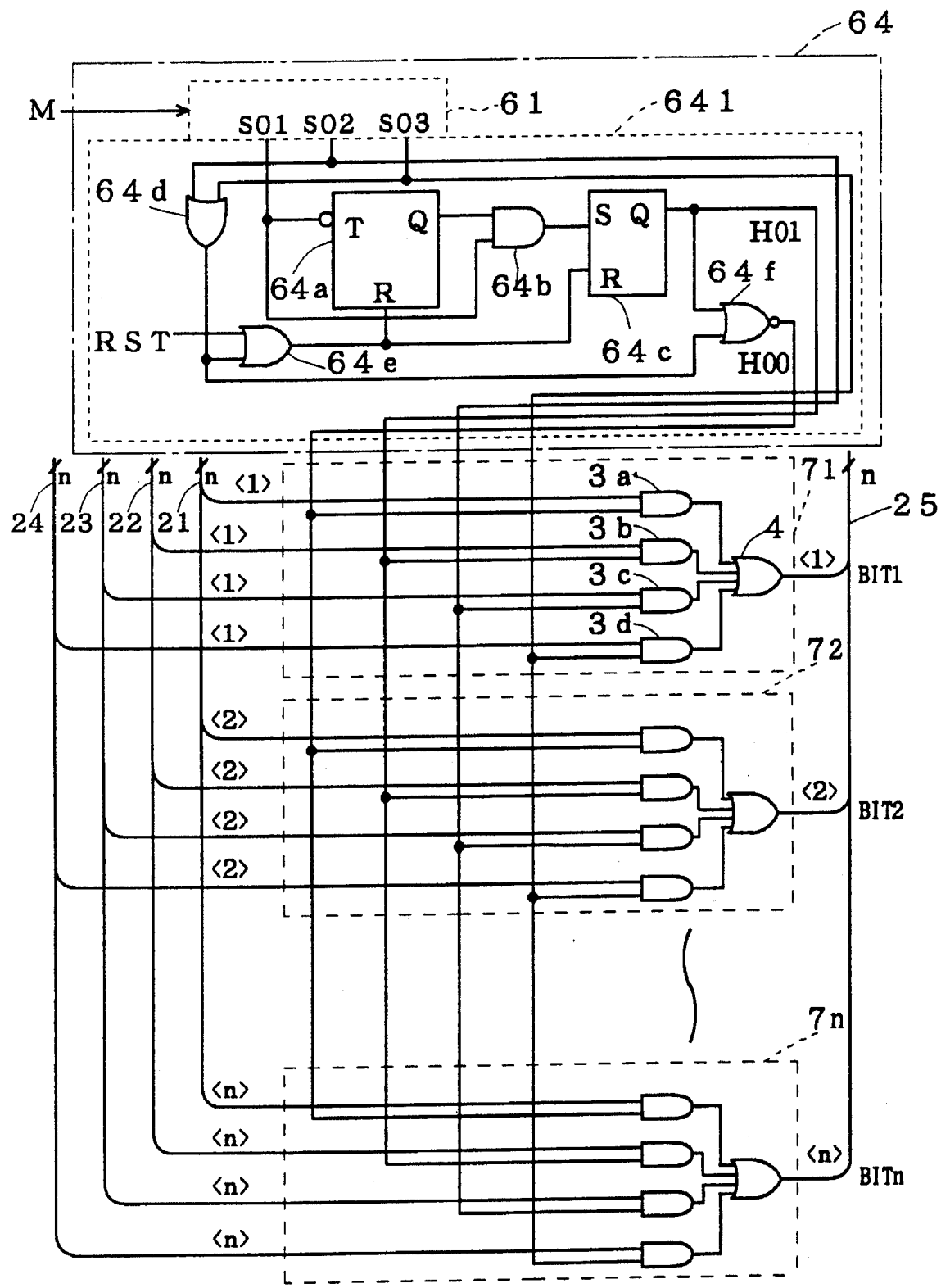
FIG. 15 is a circuit diagram showing the fifth preferred embodiment of the present invention.

E. The Fifth Preferred Embodiment:

FIG. 15 is a block diagram showing a configuration of a mode determination unit 64 and its connection with the logical processing units $7, 7_2, \ldots, 7_n$ according to the fifth preferred embodiment. The mode determination unit 64 is the substitution for the mode determination unit 61 of the signal selecting means 101 according to the first preferred embodiment and has an arrangement where a logic circuit 641 is further provided. The logical processing units $7_1, 7_2, \ldots 7_n$ in the fifth preferred embodiment are supplied with control signals $H_{00}$ and $H_{01}$ instead of the control signals $S_{00}$ and $S_{01}$.

The logic circuit 641 has an arrangement where an T flip flop 64a, an AND gate 64b, an RS flip flop 64c and OR gates 64d to 64f are provided. The T flip flop 64a comprises a toggle terminal T for receiving the signal $S_{01}$ outputted from the decoder 51 and a reset terminal R for receiving an output of the OR gate 64e which is the logical sum of a reset signal RST and an output from the OR gate 64d. The RS flip flop 64c comprises a reset terminal R which also receives the output from the OR gate 64e. Since the OR gate 64d receives the signals $S_{02}$ and $S_{03}$ outputted from the decoder 51, the T flip flop 64a and the RS flip flop 64c can be reset by not only the reset signal RST but also the signal $S_{02}$ or $S_{03}$.

An output from the T flip flop 64a is applied to one of the input ends of the AND gate 64b. The other input end of the AND gate 64b receives the signals $S_{01}$. An output from the AND gate 64b is applied to a set terminal S of the RS flip flop 64c. The RS flip flop 64c outputs the control signal $H_{01}$, which is applied to one of the input ends of the NOR gate 64f.

The NOR gate 64f receives the logical sum of the signals $S_{02}$ and $S_{03}$ outputted from the decoder 51 by the other input end, and outputs the control signal $H_{00}$. Therefore, the control signal $H_{00}$ is a default like in the first preferred embodiment, taking "1" when none of the other signals $H_{01}$, $S_{02}$ and $S_{03}$ take "1", and outputs the control signal $H_{00}$.

Figure 16:
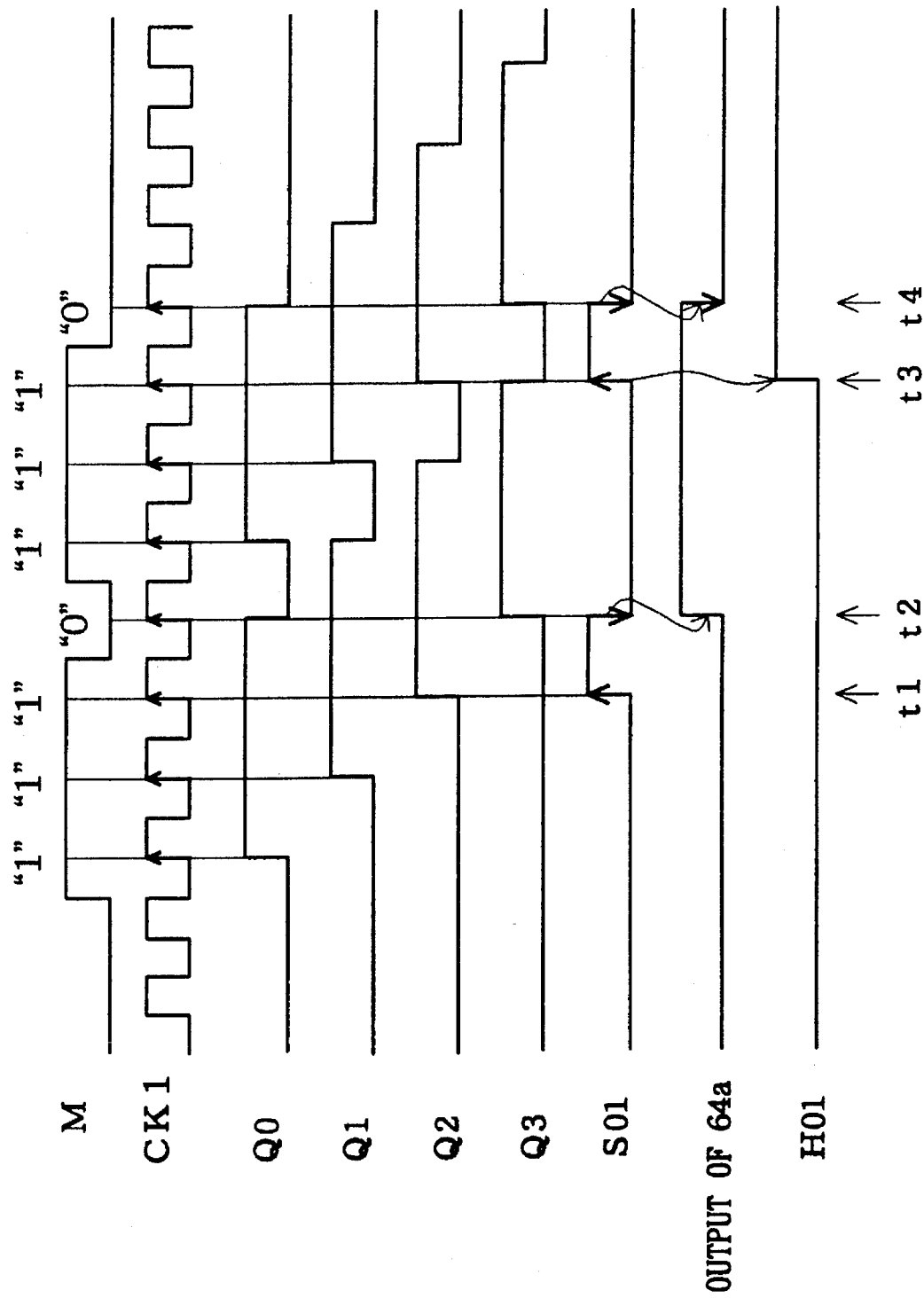
FIG. 16 is a waveform chart illustrating the operation in accordance with the fifth preferred embodiment of the present invention.

FIG. 16 is a waveform chart where the control signal $H_{01}$ takes "1". As mentioned earlier, the signal $S_{01}$ takes "1" when the mode signal M has the bit rows "1110". When the signal $S_{01}$ rises for the first time after the reset of T flip flop 64a, the logic "1" of the signal $S_{01}$ does not pass the AND gate 64b because the output from the T flip flop 64a takes "0" (time t1).

When the signal $S_{01}$ falls (time t2), the output from the T flip flop 64a changes to logic "1". Accordingly, when the signal $S_{01}$ rises for the second time after the reset of the T flip flop 64a (time t3), the logic "1" of the signal $S_{01}$ passes the AND gate 64b and then sets the RS flip flop 64c, causing a rise of the control signal $H_{01}$.

After that, although the output of the T flip flop 64a changes to logic "0" when the signal $S_{01}$ falls (time t4), the RS flip flop 64c retains the state until the reset signal RST resets the RS flip flop 64c or the other control signal $S_{02}$ or $S_{03}$ rises. In short, only when the signal $S_{01}$ takes "1" twice, the signal $H_{01}$ rises and then remains at logic "1".

The fifth preferred embodiment, performing the foregoing operation, can not select the signal by applying the predetermined bit rows to the mode signal M to be transmitted only once. Therefore, in preparing a special function, such as maintenance, selection of the function by mistake can be prevented. Furthermore, the function can be selected by applying the predetermined bit rows to the mode signal M to be transmitted more than one time.

Figure 17:
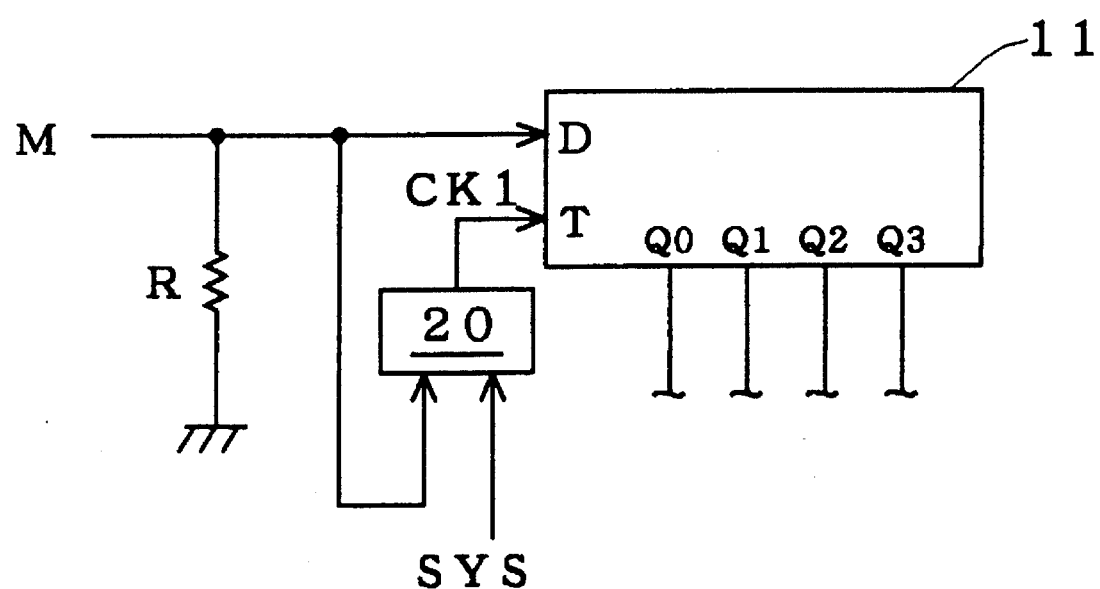
FIG. 17 is a circuit diagram showing a variation of the present invention.
Figure 18:
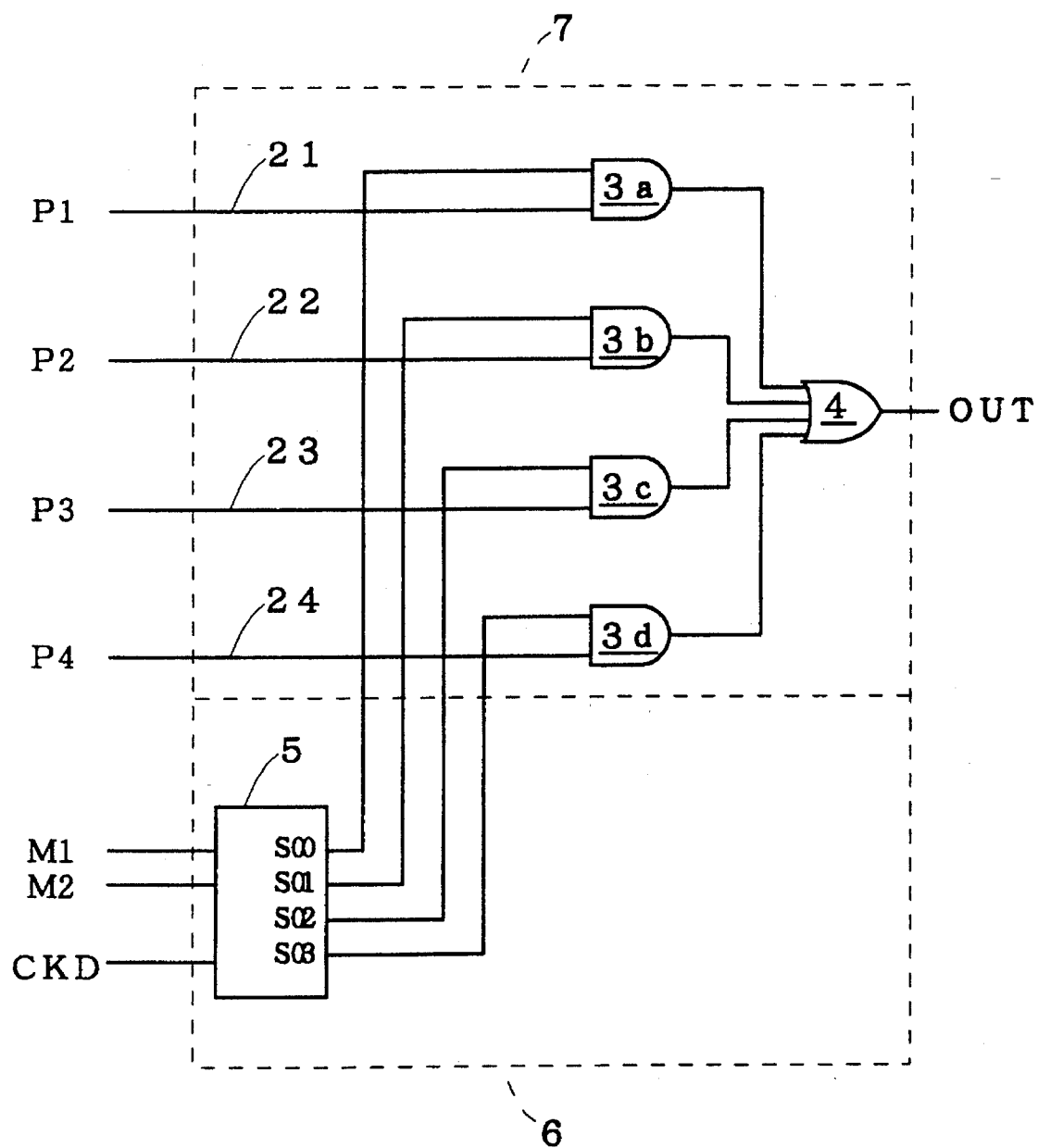
FIG. 18 is a circuit diagram showing a conventional art.

F. Variation:

FIG. 17 is a circuit diagram showing variation applicable to any of the above preferred embodiments. In an arrangement of FIG. 17, the data input terminal D of the shift register 11, which is supplied with the mode signal M, is pulled down by a resistor R. The arrangement where the resistor is additionally provided to pull down a potential is effective in the present invention.

For example, when the mode signal M is used only in a test operation, the mode signal M always transmits the value "0" in an ordinary operation. In this case, the arrangement as shown in FIG. 17 ensures pull-down, so that there arises an advantage that no wiring is required on the substrate on which the semiconductor integrated circuit including the signal selecting means is disposed.

On the other hand, since the input terminal D of the shift register 11 is pulled down by the resistor R, not directly connected to the ground potential, the shift register 11 can transmit the mode signal M in the test operation.

While the invention has been shown and described in detail, the foregoing description is in all aspects illustrative and not restrictive. It is therefore understood that numerous modifications and variations can be devised without departing the scope of the invention.

I claim:

1. A signal selecting device, comprising:
(a) a mode determination portion having:
(a-1) an input terminal for receiving a mode signal; and
(a-2) decoder means for decoding said mode signal in accordance with a clock signal into a plurality of control signals to be outputted, said mode determination portion including a clock signal generator providing said clock signal in response to a system clock and said mode signal, said mode determination portion outputting a plurality of operation mode signals in accordance with said plurality of control signals; and (b) a logical processing portion having:
(b-1) a plurality of first input ends for receiving a plurality of signals to be selected respectively;
(b-2) a plurality of second input ends for receiving said plurality of operation mode selection signals; and
(b-3) an output end for outputting one of said signals to be selected in accordance with said plurality of operation mode selection signals.

2. The signal selecting device of claim 1, wherein
said plurality of operation mode selection signals are activated in a mutually exclusive manner.

3. The signal selecting device of claim 2, wherein
said plurality of operation mode selection signals are classified into
a default signal which is activated when said mode signal has no effective information; and
a plurality of specific signals other than said default signal.

4. The signal selecting device of claim 3, wherein
one of said signals to be selected is applied to said output end in accordance with said default signal in one timing and the others of said signals to be selected are applied to said output terminal in accordance with said plurality of specific signals in another timing.

5. The signal selecting device of claim 3, wherein
one of said signals to be selected is applied to said output end in accordance with said default signal in one timing and the others of said signals to be selected are applied to said output terminal in accordance with said plurality of specific signals in the same timing.

6. The signal selecting device of claim 1, wherein
a change in logical state of said clock signal is made at an almost center point of an interval of changes in logical state of said mode signal.

7. The signal selecting device of claim 1, wherein
said signals to be selected each consist of a plurality of bits.

8. The signal selecting device of claim 1, wherein
said plurality of control signals each serve as said operation mode selection signal.

9. The signal selecting device of claim 1, wherein
said decoder means includes
(a-2-1) a clock generating portion for generating said clock signal from a system clock for a semiconductor integrated circuit including said signal selecting device and said mode signal;
(a-2-2) a first shift register for shifting said mode signal in sequence in accordance with said clock signal to obtain a transformed mode signal to be outputted; and
(a-2-3) a decoder for decoding said transformed mode signal into said control signals to be outputted, and said mode determination portion further has (a-3) a first logic circuit for applying a predetermined logical process to said control signals to obtain said operation mode selection signals to be outputted.

10. The signal selecting device of claim 9, wherein said clock generating portion comprises (a-2-1-1) a second shift register for shifting said mode signal in sequence in accordance with said system clock to obtain a first signal to be outputted;

(a-2-1-2) a second logic circuit for applying a predetermined logical process to said first signal to obtain a second signal for detecting an initial effective value of said mode signal to be outputted; and (a-2-1-3) a counter triggered in accordance with said second signal for counting said system clock to divide a frequency of said system clock so that a cycle of said system clock should be approximately equal to an interval of changes in logical state of said mode signal to obtain said clock signal to be outputted.

11. The signal selecting device of claim 9, wherein said plurality of control signals are classified into (y-1) a default control signal which is activated when said mode signal has no effective information; and (y-2) a plurality of specific control signals other than said default control signal, and said first logic circuit further comprises (a-3-1) information retaining means, having:
(a-3-1-1) a set terminal for receiving one of said plurality of specific control signals; and
(a-3-1-2) an output terminal for retaining said one of specific control signals to output a first of said operation mode selection signals, and (a-3-2) a NOR gate for taking an inversion of logical sum of said specific control signals other than said one specific control signal and said first operation mode selection signal to generate a second of said operation mode selection signals, and wherein said second operation mode selection signal is activated when said mode signal has no effective information, and said first and second operation mode selection signals are activated in a mutually exclusive manner.

12. The signal selecting device of claim 9, wherein said plurality of control signals are classified into (y-3) a default control signal which is activated when said mode signal has no effective information; and (y-4) a plurality of specific control signals other than said default control signal, and said first logic circuit further comprises (a-3-3) information retaining means, having:
(a-3-3-1) a set terminal for receiving one of said plurality of specific control signals;
(a-3-3-2) an output terminal for retaining said one of specific control signals to output a first of said operation mode selection signals; and
(a-3-3-3) a reset terminal for resetting data applied to said output terminal, and (a-3-4) a NOR gate for taking an inversion of logical sum of said specific control signals other than said one specific control signal and said first operation mode selection signal to generate a second of said operation mode selection signals;

(a-3-5) a timer triggered in accordance with said one of specific control signals, for counting a predetermined time to output a transformed signal; and (a-3-6) an AND gate for taking a logical product of said first operation mode selection signal and said transformed signal to provide said logical product for said reset terminal of said information retaining means, and wherein said second operation mode selection signal is activated when said mode signal has no effective information, and said first and second operation mode selection signals are activated in a mutually exclusive manner.

13. The signal selecting device of claim 9, wherein said plurality of control signals are classified into (y-5) a default control signal which is activated when said mode signal has no effective information; and (y-6) a plurality of specific control signals other than said default control signal, and said first logic circuit further comprises (a-3-7) first information retaining means, having:
(a-3-7-1) a trigger terminal for receiving one of said plurality of specific control signals;
(a-3-7-2) an output terminal for outputting a transformed signal of which state is inverted in response to a change in logical state of said one of specific control signals;
(a-3-7-3) a reset terminal for resetting data applied to said output terminal, and (a-3-8) an AND gate for taking a logical product of said one of specific control signals and said transformed signal to be outputted;

(a-3-9) second information retaining means, having:
(a-3-9-1) a set terminal for receiving an output from said AND gate;
(a-3-9-2) an output terminal for retaining said output from said AND gate at said set terminal of said second information retaining means to output a first of said operation mode selection signals;
(a-3-9-3) a reset terminal for resetting data applied to said output terminal of said second information retaining means, and (a-3-10) a NOR gate for taking an inversion of logical sum of said specific control signals other than said one specific control signal and said first operation mode selection signal to generate a second of said operation mode selection signals, and wherein said second operation mode selection signal is activated when said mode signal has no effective information, and said first and second operation mode selection signals are activated in a mutually exclusive manner.

14. The signal selecting device of claim 13, wherein said specific control signals other than said one specific control signal reset said first and second information retaining means.

15. The signal selecting device of claim 1, wherein said mode determination portion further has (a-4) a potential point for applying a constant potential; and (a-5) a resistor for connecting said potential point to said input terminal.

16. The signal selecting device of claim 15, wherein said constant potential is a ground potential.

* * * * *